United States Patent [19]

Franz et al.

[11] 4,074,015
[45] Feb. 14, 1978

[54] PROCESS FOR THE PRODUCTION OF NONFLAMMABLE LAMINATED MATERIALS

[75] Inventors: Arnold Franz; Siegfried Kopnick, both of Troisdorf, Germany

[73] Assignee: Dynamit Nobel Aktiengesellschaft, Germany

[21] Appl. No.: 583,766

[22] Filed: June 4, 1975

[30] Foreign Application Priority Data

June 4, 1974 Germany .............................. 2426862

[51] Int. Cl.$^2$ ............................................ B32B 27/10
[52] U.S. Cl. ................................. 428/526; 106/15 FP; 156/335; 252/8.1; 260/29.3; 427/391; 427/439; 428/531; 428/537; 428/535; 428/921
[58] Field of Search ................... 156/313, 335, 306; 106/15 FP; 252/8.1; 428/921, 531, 524, 535, 530, 537, 526; 427/382, 439, 391; 260/30.6 R, 59 R, 29.3

[56] References Cited

U.S. PATENT DOCUMENTS

| | | | |
|---|---|---|---|
| 2,193,941 | 3/1940 | Seebach | 156/335 |
| 2,801,672 | 8/1957 | Baldwin et al. | 260/29.3 |
| 2,817,386 | 12/1957 | Counos | 156/335 |
| 2,937,159 | 5/1960 | McKay et al. | 260/29.3 |
| 2,941,918 | 6/1960 | West et al. | 260/59 R |
| 2,956,037 | 10/1960 | Venable | 260/30.6 R |
| 3,133,034 | 5/1964 | St. Clair et al. | 156/335 |
| 3,377,317 | 4/1968 | Hoxie | 260/30.6 R |
| 3,715,310 | 2/1973 | Butcher | 260/30.6 R |
| 3,843,575 | 10/1974 | Dijkstra | 260/29.3 |
| 3,922,459 | 11/1975 | Franz et al. | 428/531 |

*Primary Examiner*—Charles E. Van Horn
*Assistant Examiner*—J. J. Gallagher
*Attorney, Agent, or Firm*—Craig & Antonelli

[57] ABSTRACT

A process for producing nonflammable laminated materials which includes the steps of impregnating a cellulose-containing material with an impregnating solution containing a phenolic-resol resin solution, at least one plasticizer for the resin and optionally flameproofing agents, subsequently drying the impregnated material to effect preliminary condensation of the resin and thereafter curing superimposed layers of the impregnated and preliminary condensed material by the application of heat and pressure. The phenol-resol resin solution used contains 50–80% by weight of an ammonia alkaline-condensed phenol-resol resin with a solids content of 65–80% by weight and with a molecular weight distribution determined by gel chromatography of: dimers 20–26%; tri- and tetramers 6–12%; penta- and oligomers 24–36%; expressed in percent per unit area and hexamethylenetetramine in amounts of 1–15% by weight based on the weight of the impregnating solution.

10 Claims, No Drawings

PROCESS FOR THE PRODUCTION OF NONFLAMMABLE LAMINATED MATERIALS

The present invention relates to a process for the production of laminated materials having a high flame retardance and a short afterburning time.

The production of laminated materials is conventional; in general, the first step of a known method is to impregnate a cellulose-containing material with phenolic resin and/or cresol resin solutions which optionally include plasticizers and/or flameproofing agents. The impregnated material is subsequently dried, during which step the resin continues to condense. Thereupon, several layers of this further condensed material are placed on top of one another and pressed with the use of heat and pressure to obtain the laminated material; during this procedure, the resin is cured.

The cellulose-containing material is preferably paper in the form of sheets or fibrous webs. The cellulose-containing material can, however, also be in the form of fleeces; it is also possible to replace this material partially or completely by fabrics, mats, or papers made from synthetic substances which can likewise form fibers, or by spun glass fibers or glass wool. Examples of the synthetic substances are polyesters or polyamides.

If the laminated materials are to be utilized as electric insulating material, for example as a substrate for printed circuits, individual layers are coated, by means of a hot-melt adhesive, with a metallic foil, preferably a copper foil. The manufacturer of such a composite material takes place generally simultaneously with the pressing step under heat and pressure.

For the use of laminated materials, especially kraft paper in the electrical industry, such as, for example, in radios and television apparatus, it is of special importance that the kraft paper have simultaneously a satisfactory electrical insulation ability, high mechanical strength, and ready processability into printed circuits. These mechanical and electrical properties must generally meet the following requirements:

a. Insulation resistance after 4 days at 40° C. and a relative humidity of 92% $\geq 10^{10}$ Ω.

b. Flexural strength at 23° C. in accordance with DIN (German Industry Standards) 7735 >1,100 kp./cm$^2$.

c. Punchability at 23° C. according to DIN 53 488 characteristic value $\leq 2.5$.

However, for many fields of use, the kraft paper must also be maximally flame-resistant. The test for nonflammability is conducted nowadays in case of highly qualified kraft paper materials in accordance with the testing regulations prepared by Underwriter Laboratories, U.S.A., UL Subject 94, Paragraph 280 A-K. The test is conducted as follows:

A specimen having a length of 12.7 mm. is clamped along a longitudinal axis vertically so that the front edge is suspended 9.5 mm. above the tip of a bunsen burner having a diameter of 9.5 mm. The burner is adjusted to a blue flame of 19 mm. and is held for a duration of 10 seconds centrally below the lower end of the specimen. After removal of the flame, the afterburning or afterglow time is measured. After the specimen is completely extinguished, it is subjected a second time to the bunsen burner flame under the same conditions. Also the second afterburning or afterglow time is measured.

Evaluation is effected according to three main classifications (SB, HB, and V) wherein class SB poses the lowest requirements and class V, subdivided into sub-classes V1 and V0, demands the highest requirements. Kraft paper corresponding to class V0 must, on the average, have an afterburning time of 5 seconds or less, wherein the maximum value must not exceed 10 seconds. In case of class V1, the average afterburning time must be $\leq 25$ seconds, wherein the maximum value of a test must not exceed 30 seconds.

Material satisfying the conditions of class V1 provides a good passive five protection for electric appliances wherein the insulating material can be ignited in case of failure.

However, the burning test classes V1 and V0 have heretofore been attainable only with the use of epoxy resins reinforced with glass mats or glass fabrics. These mineral reinforcements, though, cause difficulties during the mechanical working procedure, since kraft papers produced therefrom cannot be punched as well and entrail a greater amount of wear and tear on the tools.

When using cellulose paper as the reinforcing material, it is also possible to use phenolic and/or cresol resins as the impregnating agents; however, these resins must be flameproofed by the addition of flameproofing agents. It has been found, though, that only a few known flameproofing agents are suitable for this purpose, because most of the conventional flameproofing materials result in disadvantages during the working of the kraft paper or impair the electrical properties.

The additional use of flameproofing agents, among which pentabromodiphenyl ether and/or other bromination products of diphenyl ether have proved to be especially effective, entails the disadvantage, however, that these products must be intermixed with the resin or plasticizer in a separate working step.

Another disadvantage in the manufacture of the heretofore known, high-quality kraft papers resides in that the cellulose-containing material and/or the reinforcing material must be subjected to a preimpregnating and afterimpregnating procedure to obtain the aforementioned good mechanical processability. In this connection, a cresol resin solution is suitably used for the preimpregnation, and a phenol-resol resin solution is utilized for the afterimpregnation.

It has now been found that kraft papers of class V0 can be obtained by conducting the impregnation with an impregnating solution containing a phenol-resol resin, said solution containing:

a. 50–80% by weight of an ammonia alkaline condensed aqueous phenol-resol resin with a solids content of 65–80% by weight and with a molecular weight distribution determined by gel chromatography characterized by a proportion of 20–26% dimers, 6–12% trimers and tetramers, and 24–36% pentamers and oligomers, expressed in percent per unit area; and b. hexamethylenetetramine in amounts of 1–15% by weight, based on the total weight of the impregnating solution.

The process of this invention provides the additional advantage over the heretofore conventional methods of laminate manufacture in that the curing time is considerably shorter than in the processes employed heretofore. The reduction in curing time is approximately 10–30%, based on comparable manufacturing conditions for the previously known kraft papers. The curing time ranges between 30 and 90 minutes with the use of a temperature of 130°–180° C. and a pressure of 70–180 kp./cm$^2$.

The phenol-resol resins utilized in accordance with the present invention are selected from conventional products. The characteristic factor for the resins to be employed is their molecular weight distribution, determined with the aid of gel chromatography (i.e. GPC which means gel permeation chromatography).

The determination of the GPC diagrams was conducted by means of the apparatus "Waters ALC 100" with six individual "Styragel" columns ($10^4$, $10^3$, $10^2$, 60, 60 A). The measurements were conducted at room temperature with tetrahydrofuran as the solvent.

The GPC diagrams show a number of partially superimposed individual peaks which can be correlated with the kinds of molecules of a characteristic size due to calibrating measurements. To indicate the approximate quantitative ratios of the thus-determined kinds of molecules, the corresponding sizes of the peaks were estimated from the diagrams as values in percent per unit area of the GPC diagram.

The phenol-resol resins to be used in accordance with the invention may contain the individual molecule types characterized by their peaks within the following proportions of percent per unit area: (planimetric integral of peak area of GPC diagram between given molecular size limits)

| Size of Molecule A | 11 | 14 | 15 | 17.5 | 24 | 32–34 | 40–48 |
|---|---|---|---|---|---|---|---|
| Percent per unit area | 15–24 | 6–14 | 5–10 | 2–6 | 20–26 | 6–12 | 22–36 |
| Preferred | 17–22 | 7–13 | 6–9 | 3–5 | 21–24 | 7–11 | 23–35 |

According to investigations by M. Duval, B. Bloch, and S. Kohn in *Journal of Appl. Polym. Science*, vol. 16, pp. 1585–1602 (1972), the peaks with the molecule sizes of 11–17.5 A are to be correlated with the monomeric products (wherein the peak at 11 A is to be attributed to the free phenol); the peak at 24 A is to be assigned to the dimeric products, whereas the peaks at 32–34 A are to be assigned to the trimeric and tetrameric products. The remainder consists of pentameric and higher oligomeric phenol-formaldehyde compounds.

Resins with such a molecular weight distribution are sold, as aqueous solutions, for example, by the firm Bakelite-Gesellschaft mbH., Lemathe, under the trade name "VL 6514 n." Additional characteristic data of the resins to be utilized are as follows: solids content 65–80% by weight, preferably 70–80% by weight; water dilution capacity 1:0.1 to 0.3; free phenol content (based on the solution) 15–24% by weight; content of free formaldehyde (based on the solution) 0.8–2.0% by weight; gelling time at 130° C. (block method) 10–13 minutes; viscosity 500–5,000 cp., preferably 1,500–4,000 cp.

The impregnating solution furthermore contains a plasticizer providing the aforementioned nonflammability and a ready ability for punching of the laminated material. The plasticizer proportion in the impregnating solution ranges between 15 and 25% by weight, based on the weight of the impregnating solution, if the burning test classification 94 V1 is desired, and between 25 and 35% by weight, if the burning test classification 94 V0 is desirable.

Suitable plasticizers are esters of phosphoric acid with aliphatic alcohols or phenols. The alcohol component can either be a monohydric alcohol of 4–18 carbon atoms or a polyhydric alcohol with likewise 4–18 carbon atoms. The phenols are understood to means phenol as well as the various methylphenols and polyhydric phenols. Examples for such plasticizers are, inter alia, the following compounds: tributyl phosphate, tri(2-ethylhexyl) phosphate, triphenyl phosphate, tricresyl phosphate, or diphenylcresyl phosphate.

The phenol-resol resin solution to be employed can also be used while diluted in a conventional solvent. The thus-produced dilution, however, is not mandatory to attain the claimed effect, but may be chosen to yield a satisfactory impregnating effect for the cellulose-containing material. If possible, the amount of such a solvent, however, should be small, because it must be evaporated again during drying. In principle, the use of an organic solvent is unnecessary when employing the above-described resins. In contrast thereto, the resins used heretofore required the concomitant utilization of an organic solvent for the impregnating step; the proportion of the organic solvent in the impregnating solution could be up to 45% by weight. This results in an additional advantage of the production of laminated materials according to this invention: i.e. the drying of the impregnated material can be effected considerably faster, and no installations for the solvent recovery—or only small-dimensioned installations—are needed.

This invention will be further understood from the following examples.

The laminated materials used in the Examples listed in Table 1 were manufactured as follows: A commercial phenol-resol resin (T55 produced and sold by Dynamit Nobel, Troisdorf Germany) having the above-indicated molecular weight distribution and a 75% solid resin content is mixed under agitation with a 40% by weight slurry of hexamethylenetetramine in water at room temperature. Subsequently, the plasticizer, methanol as the solvent, as well as optionally the flameproofing agent are admixed thereto. A clear solution is obtained which is used as the impregnating solution in this form.

This impregnating solution has such a good impregnating behavior that even heavy (Any other paper weights within limits of 20 to 400 gr/$m^2$ may be used for impregnation.) cellulose paper of, for example, 180 gr/$m^2$ is well penetrated within reasonable impregnating times. The impregnating characteristic is so favorable that a one-time impregnation is sufficient to obtain a low water absorption (<44 mg. after a storage time of 24 hours in water of 23° C. according to DIN 7735) and a constancy of the dielectric values during moist storage of the finished laminated material.

Soda kraft paper (180 gr/$m^2$) is impregnated with this impregnating solution by dipping. The dipping time is approximately 30 seconds. The impregnation can also be effected by coating, application by a doctor knife, or other conventional methods. Thereafter the thus-impregnated paper is dried in a furnace at temperatures of about 170° C. and preliminarily condensed. At the outlet of the impregnating machine, the thus-obtained material is cut into sheets. The sheets carry a resin application of 120 parts of solid resin substance on 100 parts of paper substance. In order to obtain desired laminate properties this resin application may vary from 30 to 300 parts of solid resin substance on 100 parts of paper substance preferably from 40 to 200. Respectively six of these sheets are combined and heated under a heating press for 60 minutes under a pressure of 100 kp./$cm^2$ to 165° C. The thus-produced laminates have a nominal thickness of 1.5 mm.

The properties of these laminates are listed in Table 1. Examples 1 and 3 are laminates according to this invention, while Example 2 is a comparison product without the addition of hexamethylenetetramine. This product when compared, primarily with Example 1, demonstrates that the afterburning time could be considerably reduced by adding hexamethylenetetramine, with the electrical and mechanical characteristics remaining almost the same.

Comparative Example 2 shows furthermore that the mode of operation of this invention results in a considerably higher impregnating efficiency, and that the proportion in solids of deleterious substances is considerably lower. This amount of deleterious substances is the quantity of solid particles emitted during impregnation or drying into the exhaust air. The process as conducted in accordance with this invention thus is also considerably less polluting or requires smaller devices for collecting and/or subsequently combusting the damaging substances.

Example 4 is likewise a comparative example, wherein the product was prepared with the use of a mixture of phenol-resol resin and cresol-resol resin according to the conventional double impregnating method. In spite of its high content of flameproofing agents, this product does not fulfill the conditions of flamproofing class V1.

If, for reasons of facilitating the punching of the product, a plasticizer content is employed that is 15-25% by weight, and yet the burning classification V0 is desired in the final product, this can be accomplished by a minor addition of known flameproofing agents. Example 3 serves to demonstrate this situation.

area): dimers 20-26%; tri- and tetramers 6-12%; penta- and oligomers 24-36%;
  b. hexamethylenetetramine in amounts of 1-15% by weight and
  c. between 15 and 35% by weight of a phosphoric acid ester as the plasticizer, based on the weight of the impregnating solution.

2. A process according to claim 1, wherein the improvement further comprises curing the layers for a time ranging from 30 to 90 minutes at a temperature of 130°-180° C. and a pressure of 70-180 kp./cm$^2$.

3. A nonflammable laminated material produced by the process of claim 1.

4. A process according to claim 1, wherein the phosphoric acid ester is an ester of phosphoric acid with an aliphatic alcohol or a phenol.

5. A process according to claim 4, wherein the aliphatic alcohol is a mono- or poly- hydric alcohol containing 4-18 carbon atoms and the phenol is phenol or a methyl phenol.

6. A process according to claim 1, wherein said phosphoric acid ester is tributyl phosphate, tri (2-ethylhexyl)phosphate, triphenyl phosphate, tricresyl phosphate, or diphenylcresyl phosphate.

7. A process according to claim 1, wherein said impregnating solution further contains a flameproofing agent, the amount of phosphoric acid ester being from 15-25% by weight.

8. A process according to claim 7, wherein the flameproofing agent is pentabromodiphenyl ether.

9. A process according to claim 1, wherein said impregnating solution contains from 25 to 35% by weight of said phosphoric acid ester.

TABLE 1

|  | Standard | Unit | Example 1 | Example 2 | Example 3 | Example 4 |
|---|---|---|---|---|---|---|
| Burn Test Classification | UL Subject 94 | — | 94 V0 | 94 V1 | 94 V0 | 94 HB |
| Afterburning time | UL Subject 94 | sec. | 1-8 | 5-22 | 2-9 | 10-50 |
| Insulation resistance | DIN 7735 | $10^{10}\Omega$ | 27 | 25 | 24 | 28 |
| Water absorption | DIN 7735 | mg. | 23 | 24 | 25 | 24 |
| Flexural strength transverse | DIN 7735 | kp./cm$^2$ | 1350 | 1350 | 1420 | 1300 |
| Punchability 60° C. | DIN 53 488 | symbol | 2.0 | 2.0 | 2.5 | 2.0 |
| Pentabromodiphenyl ether |  | PW | 0 | 0 | 5 | 10 |
| Hexamethylenetetramine |  | PW | 10 | 0 | 10 | 0 |
| Phenol-resol resin |  | PW | 60 | 70 | 65 | 24 |
| Cresol-resol resin |  | PW | 0 | 0 | 0 | 46 |
| Tricresyl phosphate |  | PW | 30 | 30 | 20 | 30 |
| Methanol |  | PW | 5 | 5 | 5 | 100 |
| Water |  | PW | 25 | 25 | 25 | 0 |
| Soda kraft paper (180 g./cm$^2$) |  | PW | 80 | 80 | 80 | 80 |
| Impregnating efficiency |  | kg./h | 180 | 100 | 180 | 100 |
| Deleterious substance, quantity in solid particles |  | kg./h | 6 | 10 | 6 | 10 |
| Deleterious substance, quantity in the solvent |  | kg./h | 5 | 5 | 5 | 100 |
| Curing time |  | min. | 60 | 75 | 60 | 80 |

What is claimed is:

1. In a process for the production of nonflammable laminated materials by the impregnation of cellulose-containing material with an impregnating solution containing a phenolic-resol resin solution, and at least one plasticizer, subsequently drying the thus-impregnated material under preliminary condensation of the resin, and thereafter curing superimposed layers of this impregnated and preliminarily condensed material with the use of heat and pressure, the improvement wherein there is used an impregnating solution containing:
  a. 50 to 80% by weight of an ammonia alkaline-condensed aqueous phenol-resol resin with a solids content of 65-80% by weight and with following molecular weight distribution determined by gel chromatography (expressed in percent per unit 10. In a process for the production of nonflammable laminated materials by the impregnation of cellulose-containing material with an impregnating solution containing a phenol-resol resin solution and at least one plasticizer, subsequently drying the thus-impregnated material under preliminary condensation of the resin and thereafter securing superimposed layers of this impregnated and preliminarily condensed material with the use of heat and pressure, the improvement wherein said impregnating solution consists essentially of:
  a. 50 to 80% by weight of an ammonia alkaline-condensed aqueous phenol-resol resin with a solids content of 65-80% by weight and with the following molecular weight distribution determined by gel chromatography (expressed in percent per unit area): dimers 20–26%; tri- and tetramers 6–12%; penta- and oligomers 24–36%;
b. 1–15% by weight of hexamethylenetetramine;
c. between 15 and 35% by weight of a phosphoric acid ester as the plasticizer, based on the weight of the impregnating solution, and curing of said superimposed layers is effected for a time ranging from 30 to 90 minutes at a temperature of 130°–180° C. at a pressure of 7–180 kp./cm².

* * * * *